United States Patent
Böhm et al.

(10) Patent No.: US 6,538,950 B2
(45) Date of Patent: Mar. 25, 2003

(54) INTEGRATED MEMORY AND CORRESPONDING OPERATING METHOD

(75) Inventors: Thomas Böhm, Zorneding (DE); Heinz Hönigschmid, East Fishkill, NY (US); Georg Braun, München (DE); Zoltan Manyoki, CDN-Kanata (CA); Stefan Lammers, Wappingers Falls, NY (US); Thomas Rohr, Aschheim (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/917,553

(22) Filed: Jul. 27, 2001

(65) Prior Publication Data

US 2002/0044493 A1 Apr. 18, 2002

Related U.S. Application Data

(63) Continuation of application No. PCT/DE00/00202, filed on Jan. 25, 2000.

(30) Foreign Application Priority Data

Jan. 27, 1999 (DE) .......................................... 199 03 198

(51) Int. Cl.[7] .................................................. G11C 8/00
(52) U.S. Cl. .............. 365/230.02; 365/205; 365/189.02
(58) Field of Search ........................... 365/230.02, 205, 365/189.02

(56) References Cited

U.S. PATENT DOCUMENTS

| | | | | |
|---|---|---|---|---|
| 5,276,641 A | * | 1/1994 | Sprogis et al. | 365/189.02 |
| 5,570,316 A | | 10/1996 | Lysinger | 365/196 |
| 6,026,010 A | * | 2/2000 | Ema et al. | 365/149 |
| 6,052,303 A | * | 4/2000 | Chevallier et al. | 365/185.03 |
| RE36,993 E | * | 12/2000 | Takashima et al. | 365/149 |

* cited by examiner

*Primary Examiner*—Richard Elms
*Assistant Examiner*—Tuan T. Nguyen
(74) *Attorney, Agent, or Firm*—Laurence A. Greenberg; Werner H. Stemer; Gregory L. Mayback

(57) ABSTRACT

An integrated memory has a multiplexer and a differential sense amplifier with a differential input. The differential sense amplifier is connected to three bit lines by the multiplexer. The multiplexer electrically connects the differential input of the sense amplifier to any two of the three bit lines connected to it respectively, in accordance with its activation.

3 Claims, 2 Drawing Sheets

| WL0 | WL1 | WL2 | MUX0 | MUX1 | MUX2 |
|-----|-----|-----|------|------|------|
| 1 | 0 | 0 | 1 | 0 | 0 |
| 0 | 1 | 0 | 0 | 1 | 0 |
| 0 | 0 | 1 | 0 | 0 | 1 |

INTEGRATED MEMORY AND
CORRESPONDING OPERATING METHOD

CROSS-REFERENCE TO RELATED
APPLICATION

This application is a continuation of copending International Application No. PCT/DE00/00202, filed Jan. 25, 2000, which designated the United States.

BACKGROUND OF THE INVENTION

1. Field of the Invention

The invention relates to an integrated memory with memory cells configured in crossing points of word lines and bit lines and relates to an integrated memory with a differential go read amplifier.

An integrated memory in the form of a DRAM (Dynamic Random Access Memory) is disclosed in Betty Prince: "Semiconductor Memories", John Wiley & Sons, West Sussex, $2^{nd}$ edition 1996, chapter 5.8.5 and FIG. 5.14. A pair of bit lines is connected with a differential read amplifier. This is a typical configuration for DRAMs. It is also known from the same book, FIG. 6.54 (e) to configure the memory cells of a DRAM, in the crossing points of a word line, with both bit lines of a bit line pair, which is connected to the same read amplifier.

SUMMARY OF THE INVENTION

It is accordingly an object of the invention to provide an integrated memory that has a space-saving construction and whereby data to be read out are amplified by a differential read amplifier.

With the foregoing and other objects in view there is provided, in accordance with the invention, an integrated memory that includes word lines and bit lines that cross the Ad word lines and thereby define crossing points. The memory also includes memory cells that are configured at the crossing points of the bit lines and the word lines. The memory includes a differential read amplifier having a differential input and a multiplexer having a control input. The multiplexer is connected to three of the bit lines. The multiplexer, dependent on the control input, electrically connects the differential input of the read amplifier to two arbitrary ones of the three of the bit lines.

Given the inventive integrated memory, the differential read amplifier is connected via a multiplexer to three of the bit lines and the multiplexer, dependent on its control, electrically connects a differential input of the read amplifier to two of the three arbitrary bit lines connected to it.

In contrast to the prior art, the read amplifier therefore is not always connected to the same bit line pair with respect to the inventive memory. Rather, three differently combined bit line pairs result, which each have a different respective combination of two of the three bit lines.

In accordance with an added feature of the invention, the integrated memory has a first type of word lines, which have memory cells at crossing points of the first and the second bit line, and a second type of world lines, which have memory cells at crossing points of the first and the third bit line, as well as a third type of word lines, which have memory cells at crossing points of the second and the third bit line.

With the foregoing and other objects in view there is provided, in accordance with the invention, an operating method that is suitable for operating this embodiment of the integrated memory. Complementary data is stored in the two memory cells that are connected to the same world line and is read out again. When a read or a write access is performed, the two bit lines connected to these two memory cells are electrically connected via the multiplexer to the differential input of the read amplifier. Given a write access or respectively, a read access, the two memory cells, which are configured at the crossing points of two of the three bit lines, are therefore selected via the corresponding word line and are connected to the corresponding bit lines. The two corresponding bit lines are connected via the multiplexer to the read amplifier, so that data is simultaneously written into both memory cells when performing a write operation and so that data is simultaneously read out from both memory cells when performing a readout operation. Given a write access, since the read amplifier operates differentially, it generates complementary signals on the two bit lines that are electrically connected to it, so that complementary signals are also written into the two memory cells allocated to the same word line. During a read access with respect to these memory cells, the data that is complementary to one another is read out again and is amplified by the read amplifier.

Other features which are considered as characteristic for the invention are set forth in the appended claims.

Although the invention is illustrated and described herein as embodied in an integrated memory and corresponding operating method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED
EMBODIMENTS

Figures 1, 2:
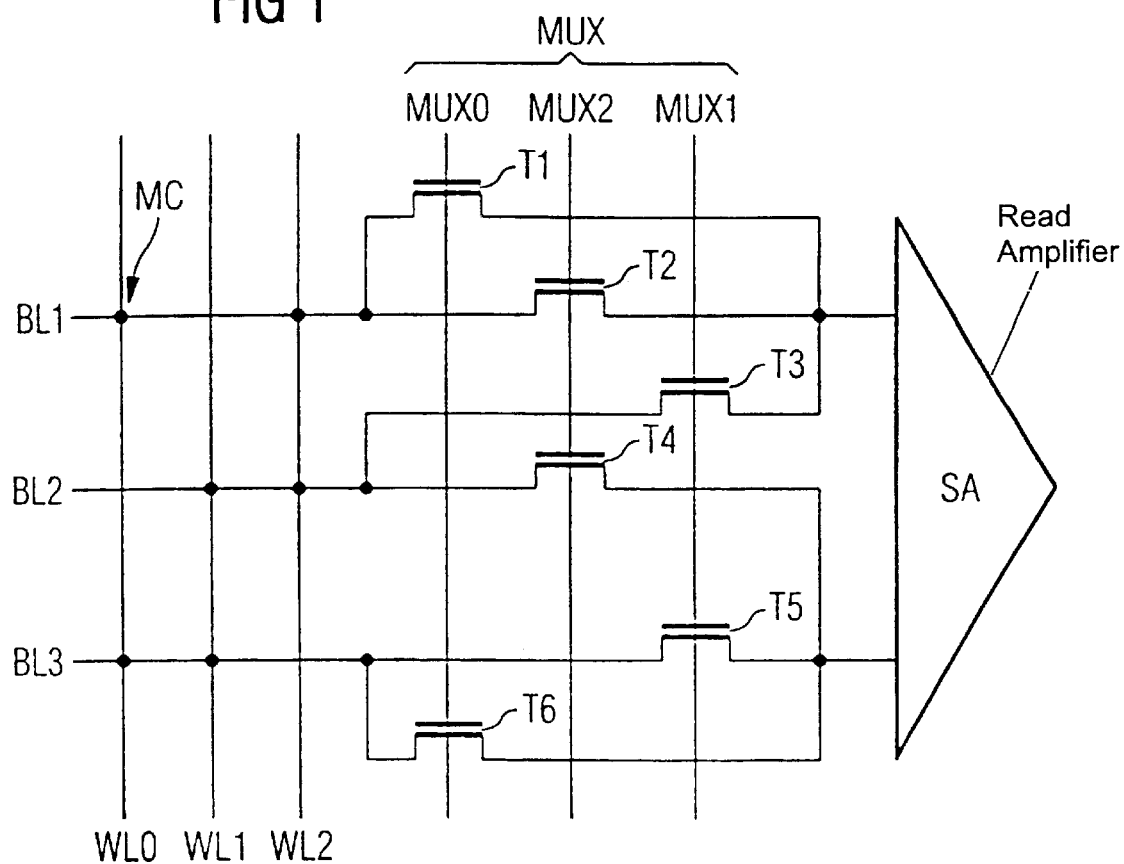
FIG. 1 shows a section of an inventive integrated memory.
FIG. 2 shows a signal table with respect to the exemplary embodiment shown in FIG. 1.
Figure 3:
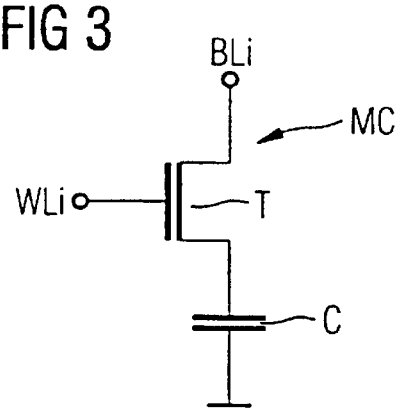
FIG. 3 shows a memory cell of the memory shown in FIG. 1.

Referring now to the figures of the drawing in detail and first, particularly, to FIG. 1 thereof, there is shown an inventive integrated memory in the form of a DRAM. It has memory cells MC in crossing points of word lines WLi and bit lines BLi. The memory cells MC are of the type as shown in FIG. 3 and are 1-transistor-1-capacitor memory cells with a memory capacitor C. The memory capacitor C has an electrode that is connected to a reference potential and another electrode that is connected via a selection transistor T to the corresponding bit line BLi. A control terminal of the selection transistor T is connected to the corresponding word line WLi.

FIG. 1 shows the memory cells MC by using thicker points at the crossing points of the word lines and bit lines. In FIG. 1, three bit lines BLi are connected via a multiplexer MUX to the differential input of a differential read amplifier SA. The read amplifier SA is constructed as is conventional for DRAMs and is therefore is not shown in greater detail. The upper terminal of the read amplifier SA is connected to the first bit line BL1 via a first transistor T1 and a second transistor T2 configured parallel thereto. Furthermore, the upper terminal of the read amplifier SA is connected via a third transistor T3 to the second bit line BL2. The lower terminal of the read amplifier SA is also connected to the second bit line BL2 via a fourth transistor T4. In addition, the lower terminal is connected to the third bit line BL3 via a fifth transistor T5 and a sixth transistor T6 configured parallel to it. The transistors T1 to T6 are n-channel transistors. They represent a part of the multiplexer MUX. The gates of the first transistor T1 and of the sixth transistor T6 are connected to a first control input MUX0, the gates of the third transistor T3 and of the fifth transistor T5 are connected to a second control input MUX1 and the gates of the second transistor T2 and of the fourth transistor T4 are connected to a third control input MUX2.

FIG. 2 shows a signal table for explaining the functions of the memory shown in FIG. 1. For example, if the word line WL0 is selected by a word line decoder (not shown in FIG. 1) and is brought to a high potential, the memory cells MC connected to the word line WL0 are connected to the corresponding bit lines BL1 and BL3. At the same time, the two other word lines WL1 and WL2 are left at a low potential. The first control input MUX0 is brought to a high potential, so that the first bit line BL1 is connected via the first transistor T1 to the upper terminal of the read amplifier SA and so that the third bit line BL3 is connected via the sixth transistor T6 to the lower terminal of the read amplifier SA. It is thereby possible to transmit data stored by the memory capacitors of the two selected memory cells MC to the read amplifier SA. The read amplifier SA amplifies the determined signal difference and supplies the correspondingly amplified differential signal to a location outside of the memory (not shown in FIG. 1). Only one of the control inputs MUXi is simultaneously active, so that the second MUX1 and third MUX2 control input have a low potential in the described case and the transistors T2, T3, T4 and T5 remain closed. Analogous to the previously described read access, a differential signal is transmitted from the read amplifier SA to the two bit lines BL1, BL3 given write access in reversed direction. Therefore, data that is complementary to one another is written into the two memory cells MC corresponding or belonging to one another. This data can be read out again with respect to a later read access.

Given the memory shown in FIG. 1, two respective memory cells MC serve the purpose of storing common information. In other words, the two memory cells MC, which belong together and which are connected to the same word line WLi, could be seen as an individual 2-transistor-2-capacitor-memory cell. The six memory cells MC drawn into FIG. 1 form three of these two 2-transistor-2-capacitor-memory cells.

Traditional DRAMs include two bit lines of a common bit line pair that are fixedly connected to an allocated read amplifier. However, in the memory shown in FIG. 1, different respective combinations of two of the three bit lines BL1 to BL3, dependent on the control of the multiplexer MUX, can be connected to the differential input of the read amplifier SA. It is thus achieved that three bit lines can be allocated to the same read amplifier instead of only two bit lines. This has the advantage that a larger surface is available for realizing the read amplifier SA, whose proportions are to be expediently adapted to the surface required by the bit lines. There are fewer read amplifiers given a fixed number of bit lines than would be the case if a separate read amplifier were provided for respective two bit line pairs.

Figure 4:
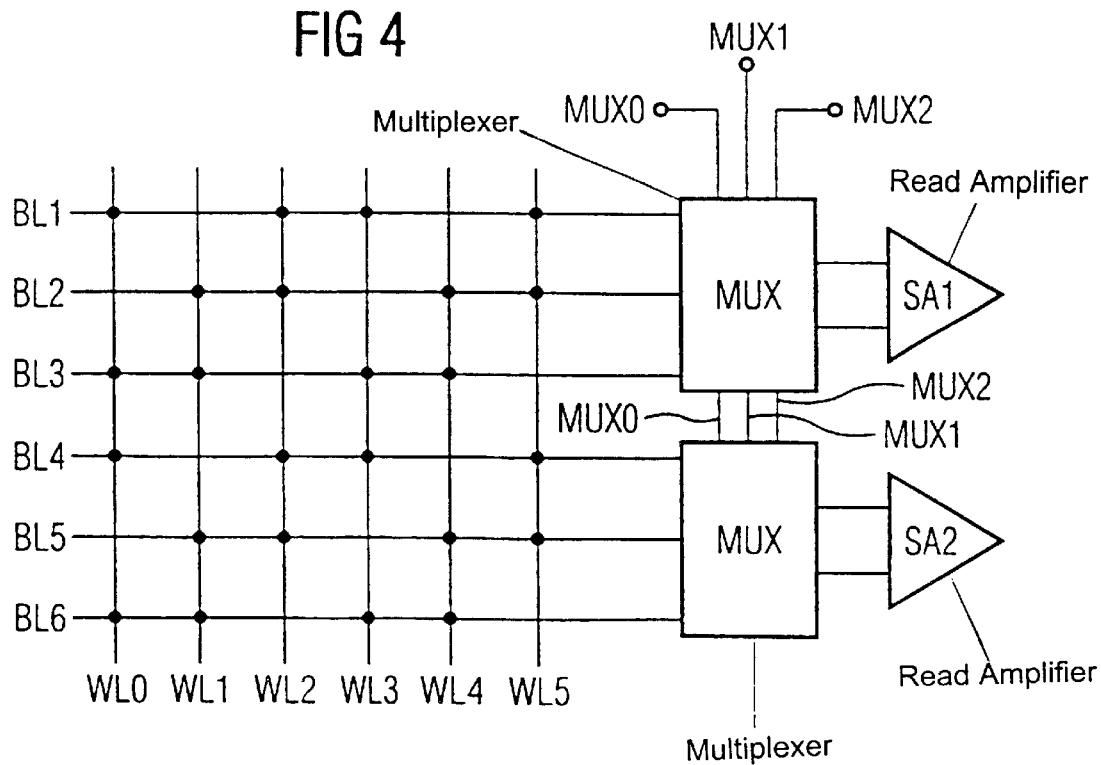
FIG. 4 shows a larger section of the memory shown in FIG. 1.

FIG. 4 shows a larger section of the memory shown in FIG. 1. The memory has six bit lines BLi and six word lines WLi. The memory cells MC, in turn, are drawn as points into the crossing points of the word lines and bit lines. Three of the bit lines BLi are respectively connected to one read amplifier SAi via respectively one multiplexer MUX. The section shown in FIG. 4 is obtained by combining two sections of the memory shown in FIG. 1. The two multiplexers MUX are identically structured. Their transistors T1 to T6 are connected to the same control inputs MUX0 to MUX2. It can be seen that the memory cells MC are evenly distributed on the word lines and the bit lines. Two memory cells MC are always configured directly adjacent to one another in both the word line direction and also in the bit line direction. A memory cell MC is connected to the crossing point between the corresponding word line and bit line. When a memory cell MC is not present at a crossing point, two memory cells MC will be adjacent thereto in both the word line direction and the bit line direction, etc.

It can be seen in FIG. 4 that the word lines WL0 and WL3, the word lines WL1 and WL4, and the word lines WL2 and WL5 form word lines of different types. The memory cells are respectively configured in crossing points with the same bit lines BLi. If one of the word lines WL0, WL3 of the first type is activated, the first control input MUX0 must be brought to a high potential. Similarly, another one of the control inputs MUXi must be respectively brought to a high potential given the word lines of the other types. This can be seen from the explanation given in regard to FIG. 2.

Although the invention has been previously exemplarily explained on the basis of a DRAM, it is also suitable for realizing other memory types, wherein a differential signal read out from memory cells is amplified by a differential read amplifier. For example, this is the case with respect to FRAMs (Ferroelectric Random Access Memories) or, respectively, FeRAMs (Ferroelectric Random Access Memories), which are structured similarly to DRAMs but have a memory capacitor with a ferroelectric dielectric.

We claim:

1. An integrated memory, comprising:
   word lines;
   bit lines crossing said word lines and thereby defining crossing points;
   memory cells configured at said crossing points of said bit lines and said word lines;
   a differential read amplifier including a differential input; and
   a multiplexer having a control input, said multiplexer connected to three of said bit lines;
   said multiplexer, dependent on said control input, electrically connecting said differential input of said read amplifier to two arbitrary ones of said three of said bit lines.

2. The integeted memory according to claim 1, wherein:
   said bit lines include a forst bit line, a second bit line, and a third bit line;
   said word lines include a first type of said word lines having ones of said memory cells located at ones of said crossing points where said first type of said word lines crosses said first bit line and said third bit line;
   said word lines include a second type of said word lines having ones of said memory cells licated at ines of said crossing points where said second type of said wird lines crosses said second bit line and said third line; and said word lines include a third type of said word lines having ones of said memory cells located at ones of said crossing points where said third type of said word lines corsses said forst bit line and said second bit line.

3. A method for operating the integrated memory according to claim 2, which comprises:

storing complementary data in two of said memory cells that are connected to a common one of said word lines;

reading out the compementary data; and performing an access selected form the group consisting of a read access and a write access by using the multiplexer to electrically connect two of said bit lines, which are connected to said two of said memory cells, to said differential input of said read amplifier.

* * * * *